(12) United States Patent
Huang et al.

(10) Patent No.: US 9,754,837 B1
(45) Date of Patent: Sep. 5, 2017

(54) CONTROLLING WITHIN-DIE UNIFORMITY USING DOPED POLISHING MATERIAL

(71) Applicant: GLOBALFOUNDRIES INC., Grand Cayman (KY)

(72) Inventors: Haigou Huang, Rexford, NY (US); Jinping Liu, Ballston Lake, NY (US); Huang Liu, Mechanicville, NY (US); Taifong Chao, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/160,409

(22) Filed: May 20, 2016

(51) Int. Cl.
| | |
|---|---|
| *H01L 29/15* | (2006.01) |
| *H01L 21/8234* | (2006.01) |
| *H01L 21/3105* | (2006.01) |
| *H01L 21/3115* | (2006.01) |
| *H01L 21/02* | (2006.01) |
| *H01L 29/66* | (2006.01) |
| *H01L 29/78* | (2006.01) |
| *H01L 21/285* | (2006.01) |
| *H01L 21/8238* | (2006.01) |
| H01L 27/088 | (2006.01) |
| H01L 27/092 | (2006.01) |

(52) U.S. Cl.
CPC .. *H01L 21/823431* (2013.01); *H01L 21/0217* (2013.01); *H01L 21/02247* (2013.01); *H01L 21/28518* (2013.01); *H01L 21/31055* (2013.01); *H01L 21/31155* (2013.01); *H01L 21/823821* (2013.01); *H01L 29/66795* (2013.01); *H01L 29/66803* (2013.01); *H01L 29/785* (2013.01); *H01L 29/7856* (2013.01); H01L 27/0886 (2013.01); H01L 27/0924 (2013.01)

(58) Field of Classification Search
None
See application file for complete search history.

(56) References Cited

U.S. PATENT DOCUMENTS

| | | | | |
|---|---|---|---|---|
| 2006/0175667 A1* | 8/2006 | Tsuchiaki | .......... | H01L 21/82382 257/391 |
| 2014/0239420 A1* | 8/2014 | Basker | .............. | H01L 29/66803 257/412 |
| 2015/0179503 A1* | 6/2015 | Tsai | .................. | H01L 21/76224 257/347 |

* cited by examiner

*Primary Examiner* — Ermias Woldegeorgis
(74) *Attorney, Agent, or Firm* — Francois Pagette; Hoffman Warnick LLC

(57) ABSTRACT

Various embodiments include methods and integrated circuit structures. In some cases, a method of forming an integrated circuit structure can include: forming a mask over an oxide layer and an underlying set of fin structures, the set of fin structures including a plurality of fins each having a substrate base and a silicide layer over the substrate base; implanting the oxide layer through an opening in the mask; removing the mask; polishing the oxide layer overlying the set of fin structures after removing the mask to expose the set of fin structures; and forming a nitride layer over the set of fin structures.

16 Claims, 8 Drawing Sheets

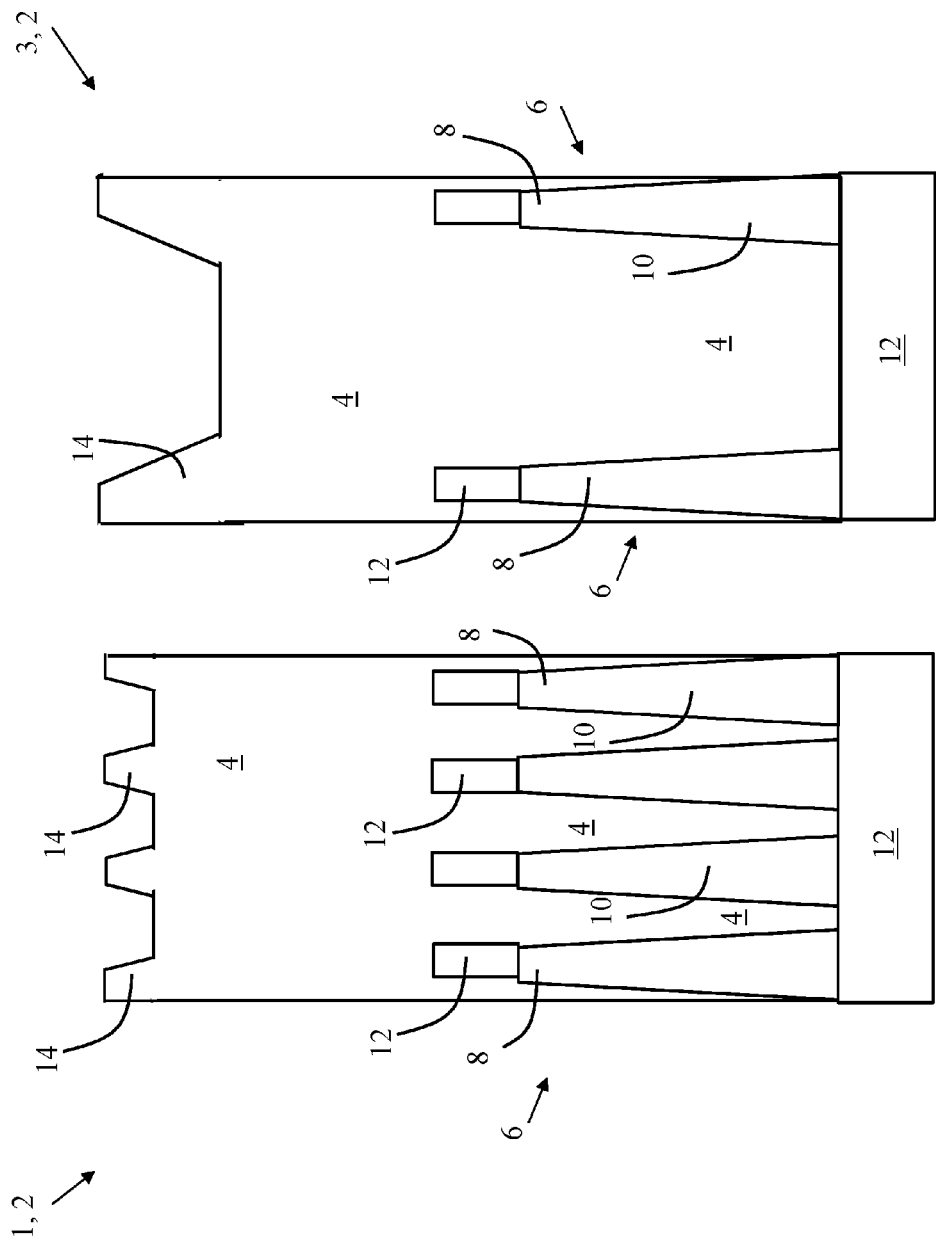

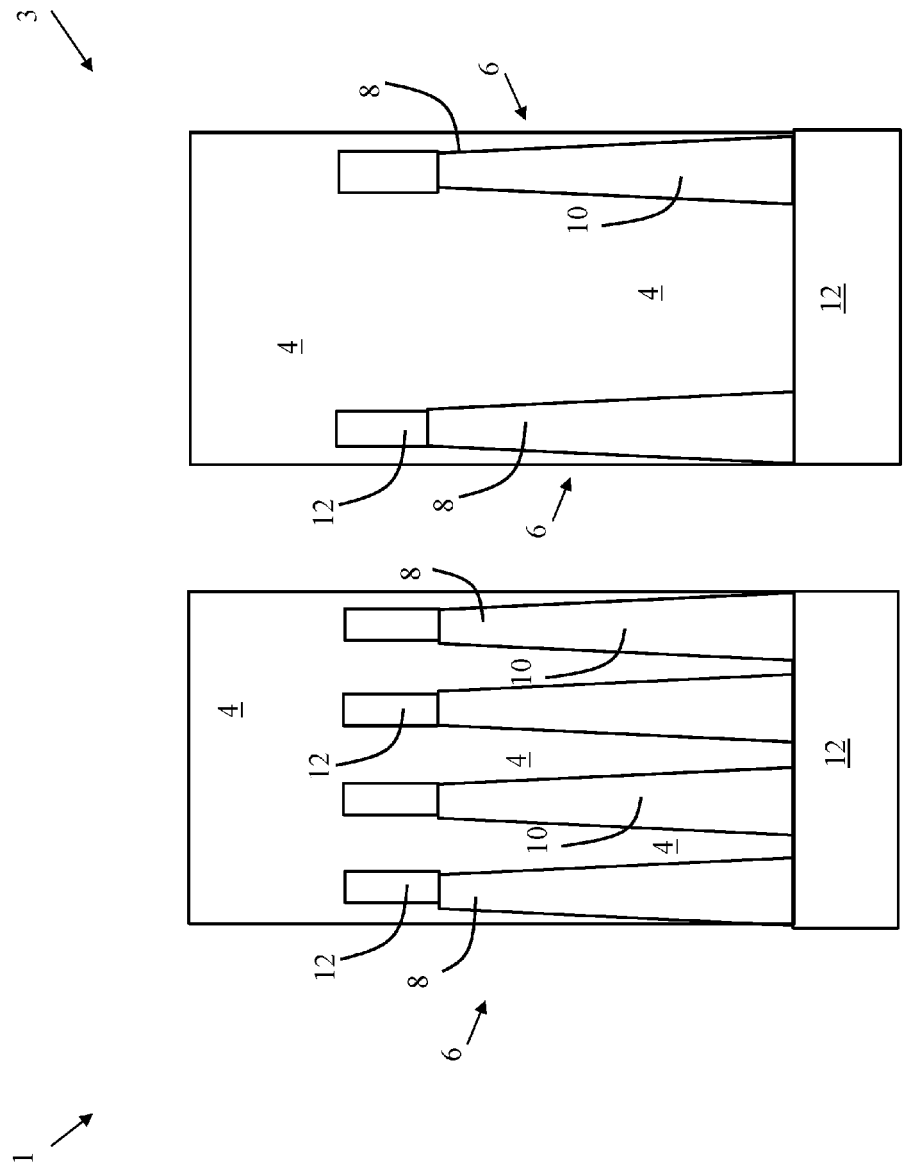

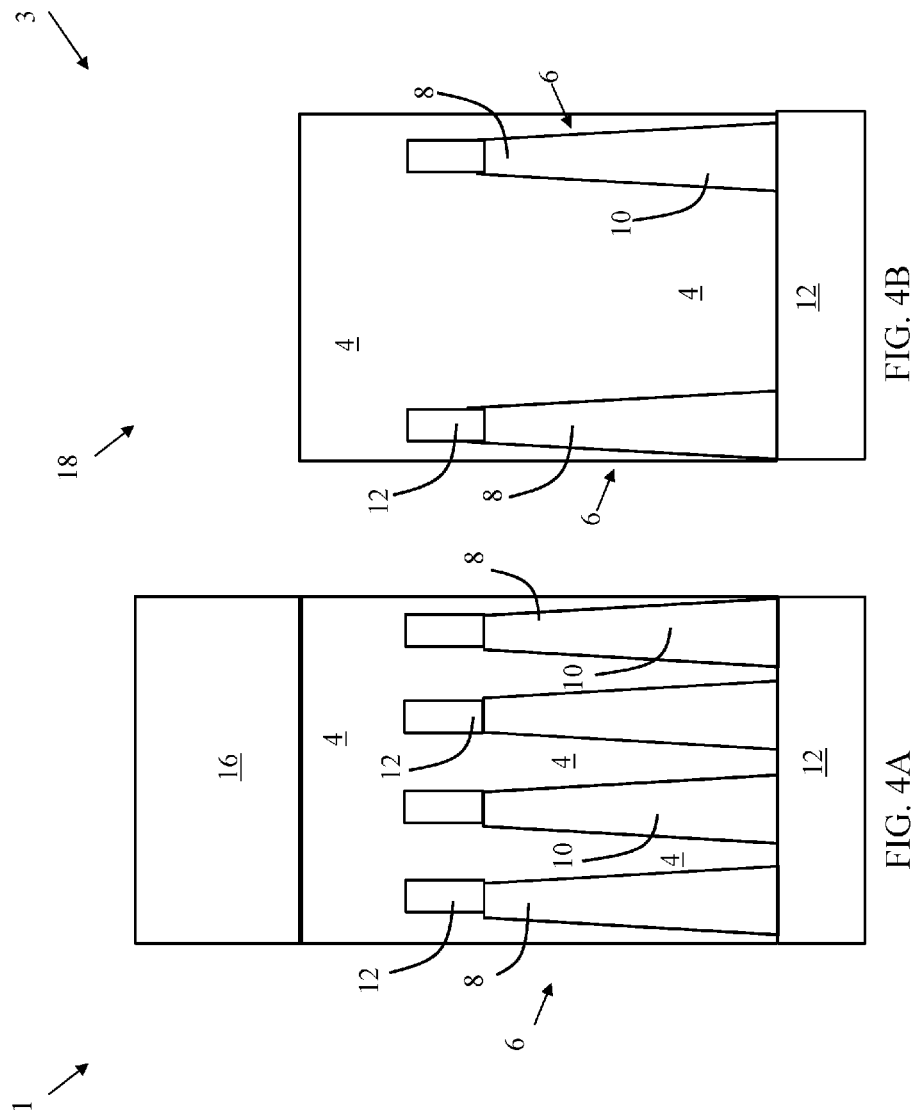

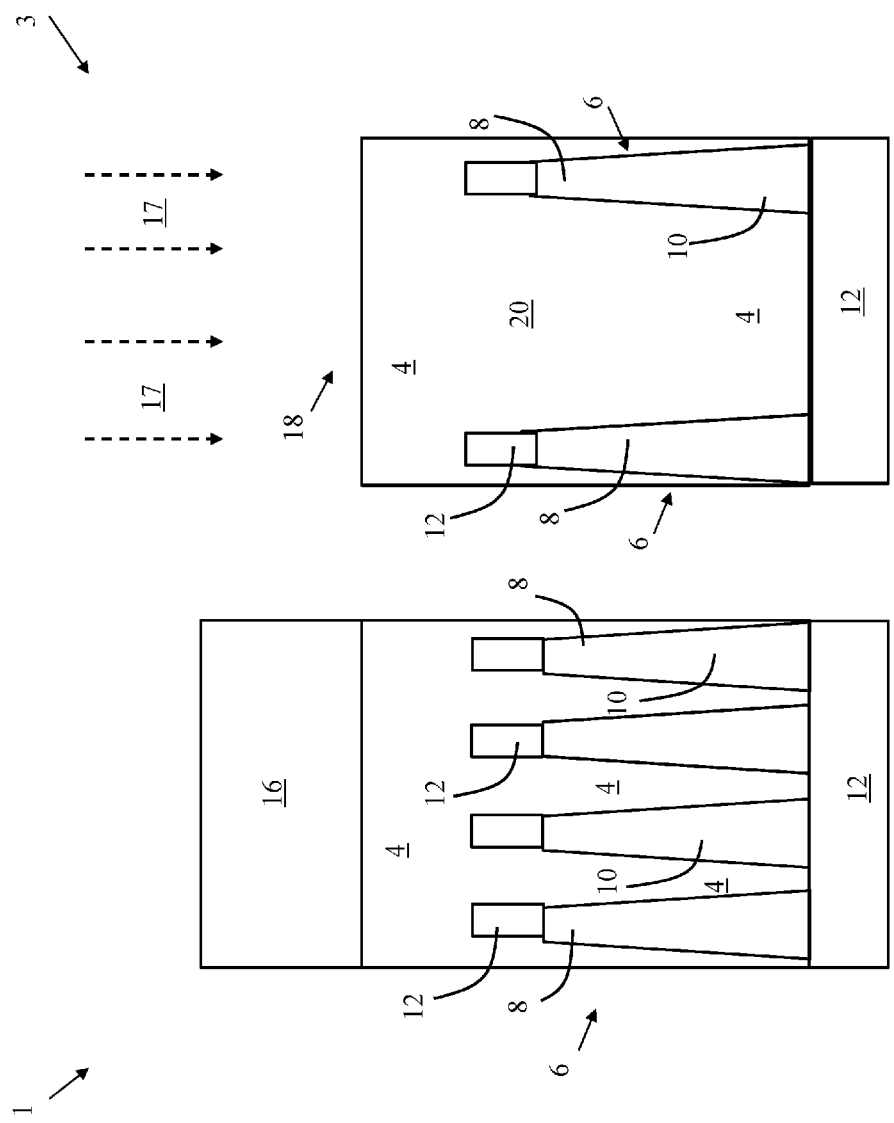

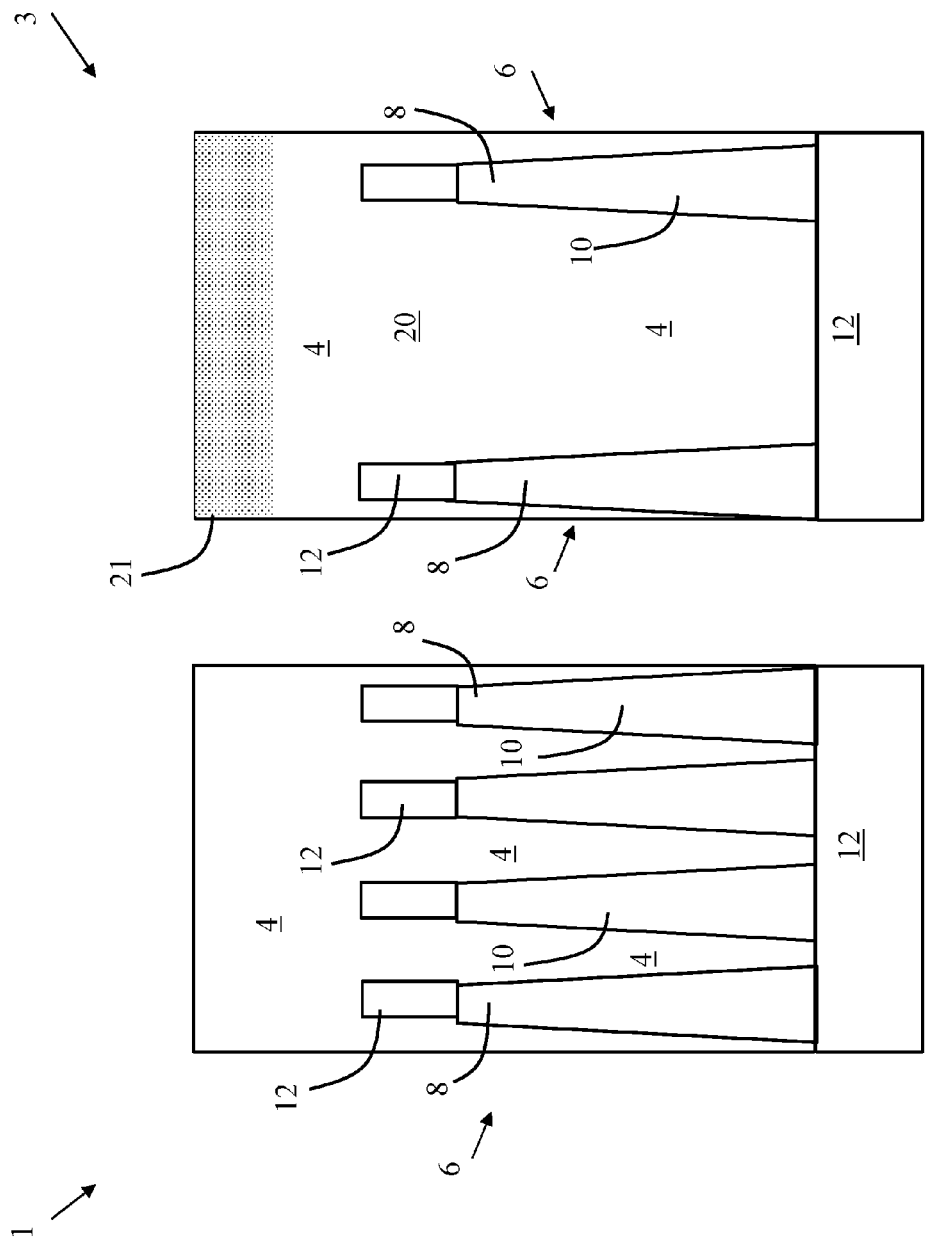

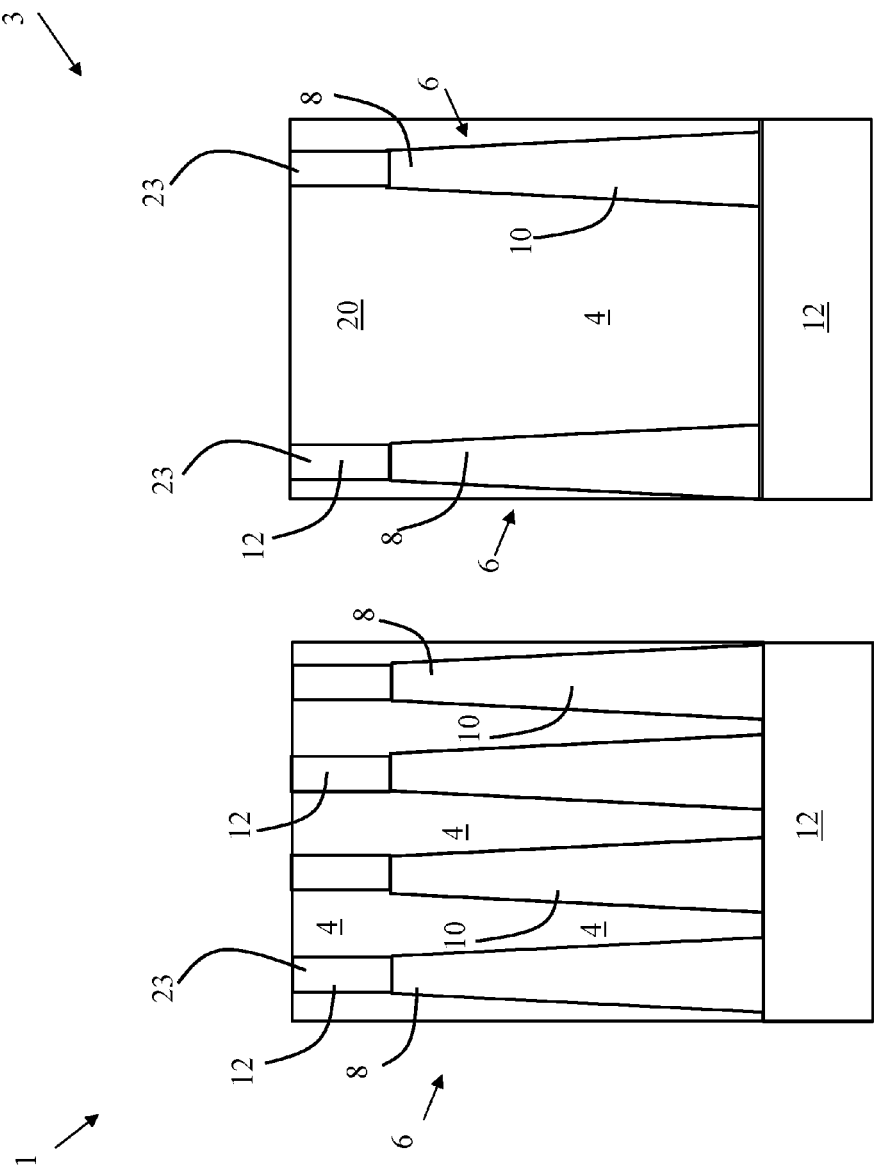

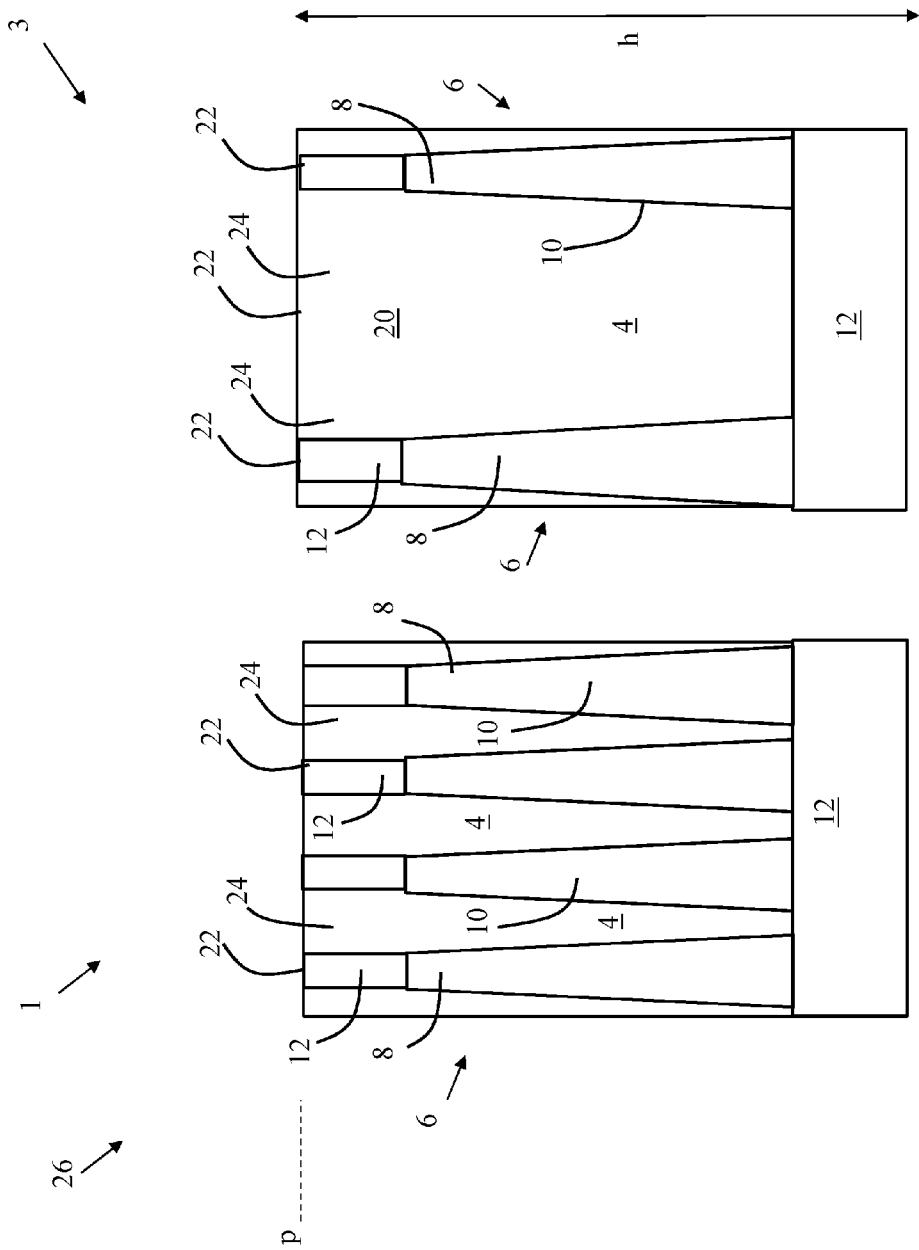

US 9,754,837 B1

CONTROLLING WITHIN-DIE UNIFORMITY USING DOPED POLISHING MATERIAL

BACKGROUND

The subject matter disclosed herein relates to integrated circuit devices. More particularly, the subject matter relates to processes in forming integrated circuit devices.

As integrated circuit (IC) technologies have advanced, the size of these devices has correspondingly decreased. In particular, as devices are reduced in scale to comply with ever-smaller packaging, tighter constraints are applied to their dimensions and spacings.

Smaller ICs call for greater uniformity within the die used to form separate IC chips. For example, some product constraints may call for less than two nanometers (nm) of within-die uniformity. These constraints may be particularly tough to meet in certain processing approaches, e.g., in chemical-mechanical polishing (CMP), where macro-loading causes variations in the density of structures within the die.

SUMMARY

Various embodiments include methods and integrated circuit structures. In some cases, a method of forming an integrated circuit structure can include: forming a mask over an oxide layer and an underlying set of fin structures, the set of fin structures including a plurality of fins each having a substrate base and a silicide layer over the substrate base; implanting the oxide layer through an opening in the mask; removing the mask; polishing the oxide layer overlying the set of fin structures after removing the mask to expose the set of fin structures; and forming a nitride layer over the set of fin structures.

A first aspect of the disclosure includes a method of forming an integrated circuit structure, the method including: forming a mask over an oxide layer and an underlying set of fin structures, the set of fin structures including a plurality of fins each having a substrate base and a silicide layer over the substrate base; implanting the oxide layer through an opening in the mask; removing the mask; polishing the oxide layer overlying the set of fin structures after removing the mask to expose the set of fin structures; and forming a nitride layer over the set of fin structures.

A second aspect of the disclosure includes a method of forming an integrated circuit structure, the method including: forming a mask over an oxide layer and an underlying set of fin structures, the set of fin structures including a plurality of fins each having a substrate base and a silicide layer over the substrate base; implanting the oxide layer through an opening in the mask with ions of at least one of carbon, phosphorous or boron; removing the mask; polishing the oxide layer overlying the set of fin structures after removing the mask to expose the set of fin structures; and forming a nitride layer over the set of fin structures, wherein a height of the nitride layer is substantially uniform across the set of fin structures.

A third aspect of the disclosure includes an integrated circuit (IC) structure having: a substrate; a set of fin structures overlying the substrate, each of the set of fin structures including a substrate base and a silicide layer over the substrate base; an oxide located between adjacent fins in the set of fin structures; and a nitride layer over the set of fin structures, wherein a height of the nitride layer is substantially uniform across the set of fin structures.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 2A shows a schematic cross-sectional view of a first region within a precursor structure, through a first set of fin structures, according to various embodiments.

FIG. 2B shows a schematic cross-sectional view of a second region in the precursor structure of FIG. 2A, with the cross-section through a second set of fin structures.

FIG. 3A shows a schematic cross-sectional view of a first region of a structure undergoing a process according to various embodiments, with the cross-section through a first set of fin structures.

FIG. 3B shows a schematic cross-sectional view of a second region of the structure of FIG. 3A, with the cross-section through a second set of fin structures.

FIG. 4A shows a schematic cross-sectional view of a first region of a structure undergoing a process according to various embodiments, with the cross-section through a first set of fin structures.

FIG. 4B shows a schematic cross-sectional view of a second region of the structure of FIG. 4A, with the cross-section through a second set of fin structures.

FIG. 5A shows a schematic cross-sectional view of a first region of a structure undergoing a process according to various embodiments, with the cross-section through a first set of fin structures.

FIG. 5B shows a schematic cross-sectional view of a second region of the structure of FIG. 5A, with the cross-section through a second set of fin structures.

FIG. 6A shows a schematic cross-sectional view of a first region of a structure undergoing a process according to various embodiments, with the cross-section through a first set of fin structures.

FIG. 6B shows a schematic cross-sectional view of a second region of the structure of FIG. 6A, with the cross-section through a second set of fin structures.

FIG. 7A shows a schematic cross-sectional view of a first region of a structure undergoing a process according to various embodiments, with the cross-section through a first set of fin structures.

FIG. 7B shows a schematic cross-sectional view of a second region of the structure of FIG. 7A, with the cross-section through a second set of fin structures.

FIG. 8A shows a schematic cross-sectional view of a first region of an integrated circuit (IC) structure according to various embodiments, with the cross-section through a first set of fin structures.

FIG. 8B shows a schematic cross-sectional view of a second region of the structure of FIG. 8, with the cross-section through a second set of fin structures.

Figure 1:
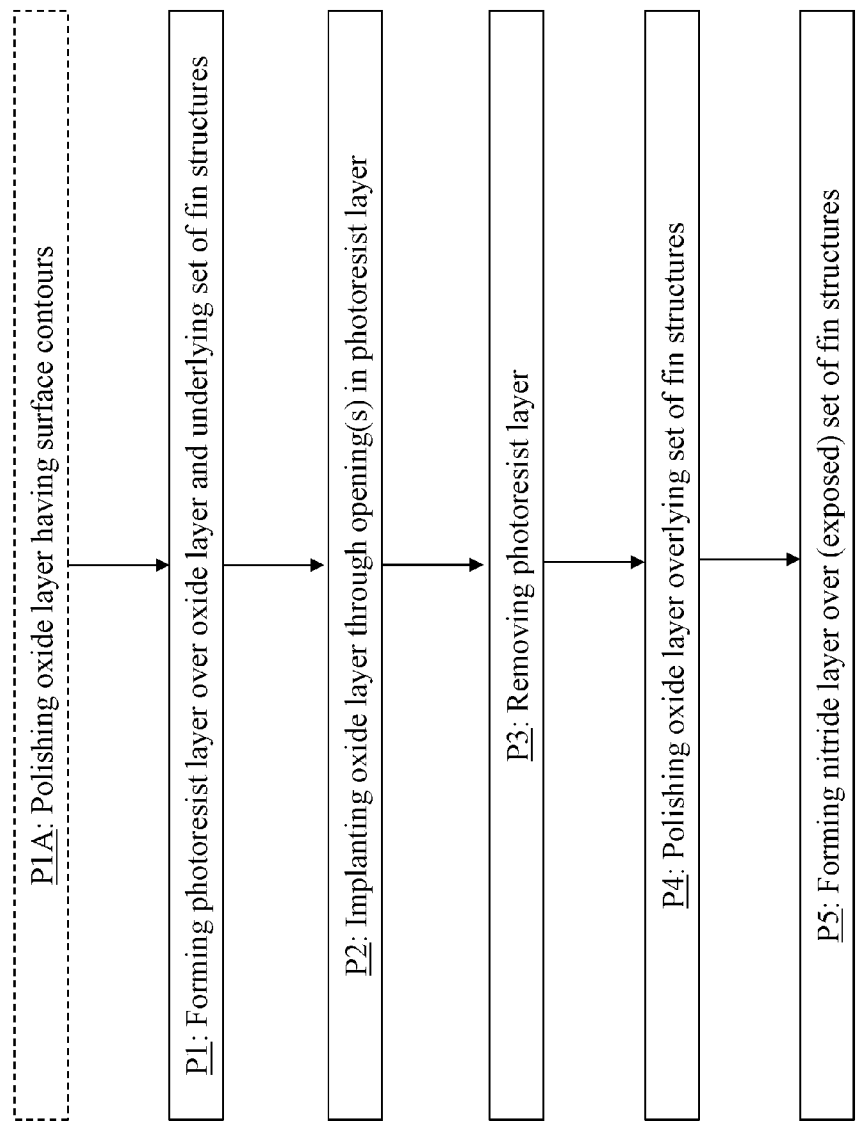
FIG. 1 is a flow diagram illustrating processes in a method according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit (IC) devices. More particularly, the subject matter relates to controlling within-die uniformity in integrated circuit devices.

As described herein, the term "within-die uniformity" refers to a consistency in height and/or density of layers within a given die. As is known in the art, in the process of forming IC devices, material layers are often formed, modified, etc. over a large wafer, which is then cut (or diced) to form individual pieces, each of which is called a die.

In contrast to conventional approaches, various embodiments of the disclosure include approaches for forming nitride regions with substantially uniform heights within a layer of an IC structure or device. That is, according to various embodiments, approaches described herein can control (e.g., enhance) within-die uniformity (e.g., height uniformity in silicide layers) in IC structures.

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 is a flow diagram illustrating processes performed according to various embodiments of the disclosure. FIGS. 2A, 2B through 8A, 8B show schematic cross-sectional depictions of regions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

Turning to FIGS. 2A, 2B through 8A, 8B, with continuing reference to FIG. 1, schematic depictions of processes of forming an integrated circuit (IC) structure 26 (FIG. 8A and FIG. 8B) performed on a first region 1 of a precursor structure 2 (FIG. 2A) and a second region 3 of precursor structure 2, are shown according to various embodiments. Figures labeled "A" depict first region 1, which includes a higher-density region (with greater number of fins 8) relative to a lower-density region (second region 3), labeled in Figures "B." As shown in FIGS. 2A and 2B, precursor structure 2 can include an oxide layer 4 over a set of fin structures 6, where the underlying set of fin structures 6 can include a plurality of fins 8 having a substrate base 10 and a silicide layer 12 overlying substrate base 10. In various embodiments, oxide layer 4 can include silicon dioxide ($SiO_2$). FIGS. 2A-7B illustrate processes, with respect to two distinct regions 1, 3 (cross-section across fins 8).

Substrate base 10 can be formed (e.g., etched) from a substrate 12, which may include silicon, doped silicon or silicon germanium. In some cases, substrate 12 can include on or more substrate materials such as silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 12 may be strained. In various embodiments, e.g., where substrate 12 includes a doped silicon, substrate 12 can include elemental semiconductor materials (e.g., silicon, germanium, carbon, or alloys thereof), III-V semiconductor materials, or II-VI semiconductor materials. According to various embodiments, the (doped) silicon substrate 12 is deposited as a bulk silicon, and subsequently ionized to dope the bulk silicon material. In other cases, a portion of substrate 12 is ionized (e.g., subjected to ionizing radiation) to form a doped silicon layer. In various embodiments, a conventional masking and etching process can be employed to form fins 8, e.g., from substrate base 10, e.g., including forming a hard mask over substrate base 10 and etching the underlying silicon (e.g., doped silicon) using the mask to remove portions of substrate base 10 between plurality of fins 8. It is understood, however, that fins 8 can be formed according to various approaches known in the art. In non-limiting examples, fins 8 can be formed by epitaxially growing at least a portion of fins 8 over substrate 12, by patterning portions of fins 8 over substrate base 12, etc.

As shown, processes according to various embodiments can include:

Process P1A (an optional pre-process according to various embodiments), which is illustrated in FIGS. 2A-2B and 3A-3B, including: polishing oxide layer 4, wherein oxide layer 4 includes surface contours 14 (FIGS. 2A, 2B) prior to the polishing (FIG. 3A, 3B). In various embodiments, surface contours 14 can include bumps or protrusions forming an uneven upper surface of oxide layer 4. In various embodiments, polishing oxide layer 4 includes performing a conventional chemical mechanical polishing (planarization) technique known in the art, e.g., using a polishing device and a chemical slurry to remove portions of oxide layer 4. As shown in FIGS. 2A and 2B, prior to polishing, surface contours 14 may exist due to the formation of oxide layer 4 over underlying fins 8 and spaces between those fins 8. Surface contours 14 can correspond with a density of fins 8 in a particular region, for example, first region 1 may have a greater concentration of surface contours 14 due to its higher density of fins 8 when compared with second region 3.

Process P1 (following process P1A, in various embodiments, illustrated in FIGS. 3A and 4A): forming a mask 16 over oxide layer 4 and an underlying set of fin structures 8. In various embodiments, mask 16 can include a conventional photoresist and/or hardmask material, such as a nitride, e.g., a silicon nitride. In some cases, mask 16 is deposited over oxide layer 4 using conventional deposition techniques, however, in other cases, mask 16 may be epitaxially grown or otherwise formed over oxide layer 4. In some cases, mask 16 may be formed using conventional photolithography techniques, including but not limited to deep ultraviolet (DUV) or extreme ultraviolet (EUV) processes, sidewall imaging transfer processes, or multiple patterning processes. In various embodiments, as shown in the side-by-side comparison of FIGS. 4A and 4B, mask 16 may be selectively formed over only a region (e.g., first region 1) and not formed over other region(s) (e.g., second region 3).

Process P2 (illustrated in FIGS. 5A and 5B): implanting (with ions 17) oxide layer 4 through an opening 18 in mask 16. As shown in FIGS. 5A and 5B, mask 16 can be formed over fins 8 in first region 1, leaving fin structures 6 in second region 3 (e.g., in regions having a lower concentration of fins 8, where fins 8 are adjacent large oxide regions 20) exposed via opening(s) 18. In various embodiments, oxide 4 and oxide regions 20 (e.g., separating adjacent sets of fin structures 6) are implanted with ions 17 via conventional ion-implant techniques. Mask 16 can prevent implanting in underlying regions of oxide 4 and fins 8. In some cases, ion implanting is performed with ions of at least one of carbon (C), phosphorous (P) or boron (B). Use of C, P or B ions for implanting can reduce the subsequent removal rate (e.g., polishing rate) of oxide 4 in second region 3 when compared with non-implanted oxide 4 in first region 1.

Process P3 (shown as post-implanted depiction in FIGS. 6A and 6B): removing mask 16, e.g., via conventional etching techniques such as wet etching or dry etching. In some cases, mask 16 can be removed from first region 1 using a chemical etching process. For example, remaining mask 16 can be removed, e.g., by dry plasma ashing or (selectively) wet cleaning (e.g., using sulfuric peroxide). As shown, a portion 21 of oxide layer 4 in second region 3, previously exposed between mask(s) 16, is implanted with ions.

Process P4 (FIGS. 7A, 7B): polishing oxide layer 4 overlying set of fin structures 6 after removing mask 16 to expose an upper surface 23 the set of fin structures 6. In various embodiments, polishing oxide layer 4 includes performing a conventional chemical mechanical polishing (planarization) technique known in the art, e.g., using a polishing device and a chemical slurry to remove portions of oxide layer 4. In some cases, polishing is performed in a single process across first region 1 and second region 3, such that additional processing is not necessary for lower-density regions (e.g., second region 3) versus higher-density regions (e.g., first region 1)

Process P5 (FIGS. 8A, 8B): forming a nitride layer 22 over the set of fin structures 6. In various embodiments, nitride layer 22 can include silicon nitride (SiN). According to some embodiments, forming nitride layer 22 can include forming (e.g., depositing) a silicon (e.g., thin layer) over the exposed set of fin structures 6 and a remaining portion 24 of oxide layer 4, and exposing the silicon to nitrogen and heat to convert the silicon to SiN. According to various embodiments, implanting oxide 4 in large oxide regions 20, e.g., in lower-density region (second region 3), can reduce the removal rate of the oxide 4 in these regions, and allow for level formation of nitride layer 22 across a wide gap between adjacent fins 8.

That is, the polishing process (P4) is a significant process in reducing free oxide residue within oxide layer 4. However, as noted herein, where large oxide regions are present, such as oxide 4 in second region 3, the macro-loading from polishing can cause conventional oxide structures to polish at different, undesirably fast, rates. According to various embodiments herein, oxide 4 in these regions (e.g., large oxide regions 20 in second region 3) is ion implanted to reduce the removal (e.g., polish) rate of that oxide 4 relative to oxide 4 in more densely-packed regions (e.g., first region 1). By reducing the removal rate of large oxide regions 20 in second region 3 relative to oxide 4 in first region 1, a more uniform upper surface can be formed between the two regions 1, 3, allowing for level formation of nitride layer 22 in IC structure 26.

According to various embodiments, as shown in the IC structure 26 in FIGS. 8A and 8B, a height (h) of nitride layer 22 is substantially uniform across set of fin structures 6, e.g., nitride layer 22 has a substantially uniform thickness across fin structures 6 and oxide 4. In other words, as measured across a flat plane (p), the substantially uniform height (h) is defined as having a deviation of less than approximately 2 nanometers across nitride layer 22 over the set of fin structures 6 and oxide 4. As noted herein, forming nitride layer 22 such that it has a height uniformity in IC structure 26 can help to overcome performance issues associated with non-uniform density in conventional integrated circuits.

It is understood that the herein-noted approaches can be implemented in any stage of integrated circuit formation, e.g., front-end of line (FEOL), back-end of line (BEOL) and/or middle of line (MOL) processes. As is known in the art, FEOL can include operations performed on the semiconductor wafer in the course of device manufacturing up to first metallization, BEOL can include operations performed on the semiconductor wafer in the course of device manufacturing following first metallization, and MOL can include operations performed on the semiconductor wafer during first metallization.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit (IC) structure, the method comprising:
    forming a mask over an oxide layer and an underlying set of fin structures, the set of fin structures including a plurality of fins each having a substrate base and a silicide layer over the substrate base;
    implanting the oxide layer through an opening in the mask;
    removing the mask;
    polishing the oxide layer overlying the set of fin structures after removing the mask to expose the set of fin structures; and
    forming a nitride layer over the set of fin structures.

2. The method of claim 1, wherein a height of the nitride layer is substantially uniform across the set of fin structures.

3. The method of claim 2, wherein the substantially uniform height is defined as having a deviation of less than approximately 2 nanometers across the nitride layer over the set of fin structures.

4. The method of claim 1, further comprising polishing the oxide layer prior to forming the mask, wherein the oxide layer includes surface contours prior to the polishing.

5. The method of claim 1, wherein the implanting includes implanting with ions of at least one of carbon, phosphorous or boron.

6. The method of claim 1, wherein the nitride layer includes silicon nitride (SiN).

7. The method of claim 6, wherein the forming of the nitride layer includes forming a silicon over the exposed set of fin structures and a remaining portion of the oxide layer and exposing the silicon to nitrogen and heat to convert the silicon to SiN.

8. The method of claim 1, wherein the substrate base includes silicon or silicon germanium.

9. The method of claim 1, wherein the oxide layer includes silicon dioxide (SiO2).

10. A method of forming an integrated circuit (IC) structure, the method comprising:
    forming a mask over an oxide layer and an underlying set of fin structures, the set of fin structures including a plurality of fins each having a substrate base and a silicide layer over the substrate base;
    implanting the oxide layer through an opening in the mask with ions of at least one of carbon, phosphorous or boron;
    removing the mask;
    polishing the oxide layer overlying the set of fin structures after removing the mask to expose the set of fin structures; and
    forming a nitride layer over the set of fin structures, wherein a height of the nitride layer is substantially uniform across the set of fin structures.

11. The method of claim 10, wherein the nitride layer includes silicon nitride (SiN).

12. The method of claim 11, wherein the forming of the nitride layer includes forming a silicon over the exposed set of fin structures and a remaining portion of the oxide layer and exposing the silicon to nitrogen and heat to convert the silicon to SiN.

13. The method of claim 10, wherein the substantially uniform height is defined as having a deviation of less than approximately 2 nanometers across the nitride layer over the set of fin structures.

14. The method of claim 10, further comprising polishing the oxide layer prior to forming the mask, wherein the oxide layer includes surface contours prior to the polishing.

15. The method of claim 10, wherein the substrate base includes silicon or silicon germanium.

16. The method of claim 10, wherein the oxide layer includes silicon dioxide (SiO2).

* * * * *